US008115506B2

(12) United States Patent
Brunner

(10) Patent No.: US 8,115,506 B2
(45) Date of Patent: Feb. 14, 2012

(54) LOCALIZATION OF DRIVER FAILURES WITHIN LIQUID CRYSTAL DISPLAYS

(75) Inventor: Matthias Brunner, Kirchheim (DE)

(73) Assignee: Applied Materials, Inc., Santa Clara, CA (US)

( * ) Notice: Subject to any disclaimer, the term of this patent is extended or adjusted under 35 U.S.C. 154(b) by 946 days.

(21) Appl. No.: 12/119,821

(22) Filed: May 13, 2008

(65) Prior Publication Data

US 2008/0284760 A1 Nov. 20, 2008

Related U.S. Application Data

(60) Provisional application No. 60/917,909, filed on May 14, 2007.

(51) Int. Cl.
*G01R 31/26* (2006.01)

(52) U.S. Cl. ........................................ 324/760.01

(58) Field of Classification Search .................... None
See application file for complete search history.

(56) References Cited

U.S. PATENT DOCUMENTS 6,639,634 B1 10/2003 Zhang et al.
6,833,717 B1 * 12/2004 Kurita et al. ............ 324/750.19
7,215,310 B2 5/2007 Song et al.
7,215,311 B2 5/2007 Kim
7,317,325 B2 * 1/2008 Brunner et al. .......... 324/760.02
7,932,880 B2 * 4/2011 Takahara et al. ................ 345/76
2005/0024971 A1 * 2/2005 Lambert ...................... 365/222
2005/0212782 A1 9/2005 Brunner
2006/0001792 A1 1/2006 Choi
2006/0125510 A1 * 6/2006 Brunner et al. ............... 324/770
2006/0244467 A1 11/2006 Abboud et al.
2011/0050675 A1 * 3/2011 Osada ...................... 324/760.01

* cited by examiner

*Primary Examiner* — Jermele M Hollington
(74) *Attorney, Agent, or Firm* — Patterson & Sheridan, L.L.P.

(57) ABSTRACT

Methods and apparatus for determining whether a malfunctioning pixel in a large area substrate, such as a liquid crystal display (LCD) panel, is due to the pixel itself or to the driver circuit for that pixel and for localizing any driver circuit defects are provided. In an effort to localize the driver circuit defects, test pads coupled to the input and/or output of certain driver circuits may be fabricated on the substrate. The voltage or charge of these test pads may be detected using any suitable sensing device, such as an electron beam, an electro-optical sensor, or an electrode in close proximity to the surface of the pixels and/or drivers capacitively coupled to the pixel or driver. For some embodiments, the defective driver circuits may be repaired in the same area as the test area or may be transported via conveyor or robot to a separate repair station.

20 Claims, 6 Drawing Sheets

LOCALIZATION OF DRIVER FAILURES WITHIN LIQUID CRYSTAL DISPLAYS

CROSS-REFERENCE TO RELATED APPLICATIONS

This application claims benefit of U.S. Provisional Patent Application Ser. No. 60/917,909, filed May 14, 2007, which is herein incorporated by reference.

BACKGROUND OF THE INVENTION

1. Field of the Invention

Embodiments of the present invention generally relate to testing systems for large area substrates having electronic devices formed thereon and, more particularly, to locating driver defects for these electronic devices.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD comprises two flat plates or panels having a layer of liquid crystal materials sandwiched therebetween. The flat plates are typically made of glass, a polymer, or other material suitable for having electronic devices formed thereon. One of the flat plates typically includes a conductive film disposed thereon and may be referred to as a color filter. The other flat plate typically includes an array of thin film transistors (TFTs), each coupled to a pixel. Each pixel is activated by providing signals to driver circuits, such as data and gate lines, and activation of the pixel may be provided by simultaneously addressing an appropriate data line and gate line. Each TFT may be switched on or off to generate an electrical field between a TFT and a portion of the color filter. The electrical field changes the orientation of the liquid crystal material, creating a pattern on the LCD.

Because of the high pixel densities, the close proximity of the gate lines and data lines, and the complexity of forming the TFTs, there is a high probability of defects during the manufacturing process. Known testing methods for high density LCD panels include contact testing methodologies, which require connection to and testing of each individual row/column intersection within the panel array. For such testing, advanced probing technology is necessary to establish reliable contacts among the densely populated pixel elements. A high density LCD array panel typically includes 640 by 480 pixels, and a typical test time for such a panel is approximately 2 hours. For a color filter having the three primary colors (i.e., red, green, and blue), a typical test cycle requires additional connections and additional testing time. The time and expense of testing, although necessary, may often be a limiting factor to the commercial success of large array LCD panels.

Prior art methods of detecting defects in the LCD panel having the array of TFTs are limited to isolation of a particular area of the TFT array without ascertaining the precise location of the defect. Additionally, an inoperable pixel may be identified, and the cause of the failure of the pixel may not be ascertained. For example, the identified pixel itself may not be defective, but may not be operational due to other factors, such as a faulty driver circuit. In this case the identified pixel may otherwise be in operable condition, but for the driver circuit defect. When this defective driver circuit is identified and localized accurately, the defect may be analyzed and repaired, which facilitates operation of the identified pixel.

One known method to identify driver defects is to recognize a certain geometrical pattern of pixel defects and determine with evaluation software that this pattern is caused by a driver defect. This determination includes localization of the driver defect by reporting the line coordinates of the pattern, or the coordinates where the pattern starts or ends. For example, if all or many pixels along a line have a defect and the density of the defective pixels does not change from one side to the opposite side of the display, this may be ascertained to be a driver defect. The location would be the location of this line. In another example, many pixels of many lines are failing starting at a certain line number n. All lines >n have these failing pixels, while all lines <n do not have failing pixels. The evaluation software could identify this geometrical pattern of pixel defects as a driver defect, and the location would be the line n where the pattern starts. However, there is a risk that this geometrical evaluation may incorrectly report a driver defect even if the problem is a line defect or a coincidental grouping of pixel defects.

Therefore, a need exists in the art for a faster and more accurate testing method in an effort to reduce the production costs of LCD panels.

SUMMARY OF THE INVENTION

Embodiments of the present invention generally relate to localizing driver defects in large area substrates, such as liquid crystal display (LCD) panels.

One embodiment of the present invention is a method for identifying a defective driver circuit on a substrate having a plurality of pixels located thereon. The method generally includes testing the plurality of pixels to determine the operability of each pixel in the plurality, locating a malfunctioning pixel within the plurality, testing a driver circuit associated with the malfunctioning pixel, and locating a defect within the driver circuit.

Another embodiment of the present invention provides a computer-readable medium containing a program for identifying a defective driver circuit on a substrate having a plurality of pixels located thereon, which, when executed by a processor, performs certain operations. The operations generally include testing the plurality of pixels to determine the operability of each pixel in the plurality, locating a malfunctioning pixel within the plurality, testing a driver circuit associated with the malfunctioning pixel, and locating a defect within the driver circuit.

Yet another embodiment of the present invention provides an apparatus for identifying a defective driver circuit on a substrate having a plurality of pixels located thereon. The apparatus generally includes an electron beam gun for producing an electron beam, one or more deflection elements configured to deflect the electron beam to at least one pixel of the plurality of pixels and to one or more test pads coupled to a driver circuit associated with the at least pixel, and a sensor for detecting secondary electrons backscattered from the at least one pixel or the test pads.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and apparatus for determining whether a malfunctioning pixel in a large area substrate, such as a liquid crystal display (LCD) panel, is due to the pixel itself or to the driver circuit for that pixel and for localizing any driver circuit defects. In an effort to localize the driver circuit defects, special test pads coupled to the input and/or output of certain driver circuits may be fabricated on the substrate, and the voltage or charge of these test pads may be detected using any suitable sensing device, such as an electron beam, an electro-optical sensor, or an electrode in close proximity to the surface of the pixels and/or drivers capacitively coupled to the pixel or driver. For some embodiments, the defective driver circuits may be repaired in the same area as the test area or may be transported via conveyor or robot to a separate repair station.

An Exemplary Flat Panel Substrate

Figure 1:
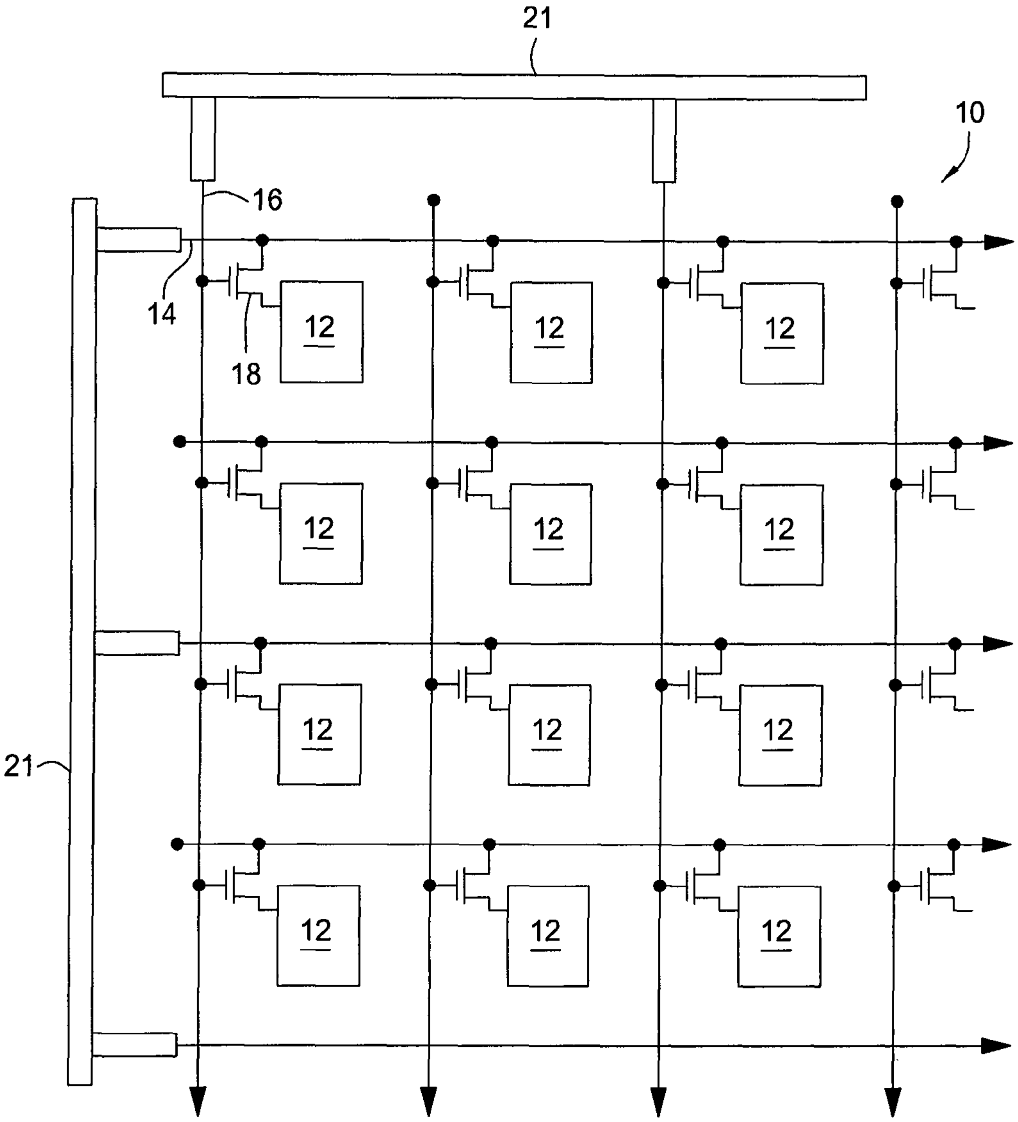
FIG. 1 (PRIOR ART)
FIG. 1 illustrates a prior art section of an exemplary large area flat panel substrate having an array of thin film transistors (TFTs), each coupled to a pixel.

FIG. 1 illustrates a section of an exemplary flat panel substrate 10 having a plurality of pixels 12 as described in commonly assigned U.S. Pat. No. 7,317,325 to Brunner et al., entitled "Line Short Localization in LCD Pixel Arrays" and issued Jan. 8, 2008, herein incorporated by reference. The flat panel substrate 10 is typically a flat, rectangular piece of glass, a polymer material, or other suitable material capable of having electronic devices formed thereon and typically has a large surface area. A thin film transistor (TFT) 18 may be associated with each pixel 12. The flat panel substrate 10 further includes data lines 14 and gate lines 16. The pixels 12, TFTs 18, data lines 14, and gate lines 16 may be formed on the flat panel substrate 10 by chemical vapor deposition (CVD), plasma enhanced chemical vapor deposition (PECVD), photolithographic methods, or other suitable fabrication processes.

In this example, every other data line 14 is terminated along an edge of the flat panel substrate, while the other data lines 14 are terminated along the opposite, but parallel, edge. Similarly, every other gate line 16 is terminated along an edge of the flat panel substrate, while the other gate lines 16 are terminated along the opposite, but parallel, edge. Other embodiments of the invention contemplate other termination configurations for the data lines 14 and the gate lines 16. For instance, all the data lines 14 may be terminated along one edge and all the gate lines 16 may be terminated along another edge perpendicular to the edge where all the data lines 14 are terminated.

During testing of the flat panel substrate 10, two or more electrostatic discharge shorting bars 21 may be coupled to the flat panel substrate 10 at its edges. A respective electrostatic discharge shorting bar 21 shorts all the data lines 14 or gate lines 16 that terminate at a respective edge. For an interdigitated flat panel substrate, data lines are terminated at two opposing edges, while gate lines are terminated at one or both of the other two edges. Thus, three or four shorting bars are included, one per flat panel substrate edge. Other embodiments contemplate different shorting bar configurations (e.g., two or more shorting bars coupled to all the data lines 14 along one edge and two or more shorting bars coupled to the gate lines 16 along another edge perpendicular to the edge where the shorting bars are coupled to the data lines). Until scribing and final testing of the LCD panel, the shorting bars 21 may most likely remain attached to the flat panel substrate 10 to avoid electrostatic charge buildup. Prolonged separation of the flat panel substrate 10 from the shorting bar 21 or another grounding apparatus may cause the electro-static charge to accumulate and cause damage to the active plate circuitry.

Because of the high pixel densities, the close proximity of the gate lines and data lines, and the complexity of forming the TFTs, there is a significant probability of defects occurring during the fabrication process. TFT defects on flat panel substrates include pixel defects and/or line defects. Pixel defects may include short to pixel gate line and short to pixel data line. Line defects may include line-to-line shorts (e.g., data line to data line or gate line to gate line), cross shorts (e.g., data line to gate line), and open line defects. Other flat circuit panels, such as printed circuit boards and multi-chip modules, may also be tested according to the various embodiments described herein.

An Exemplary Test System for Identifying Malfunctioning Pixels

Figure 2:
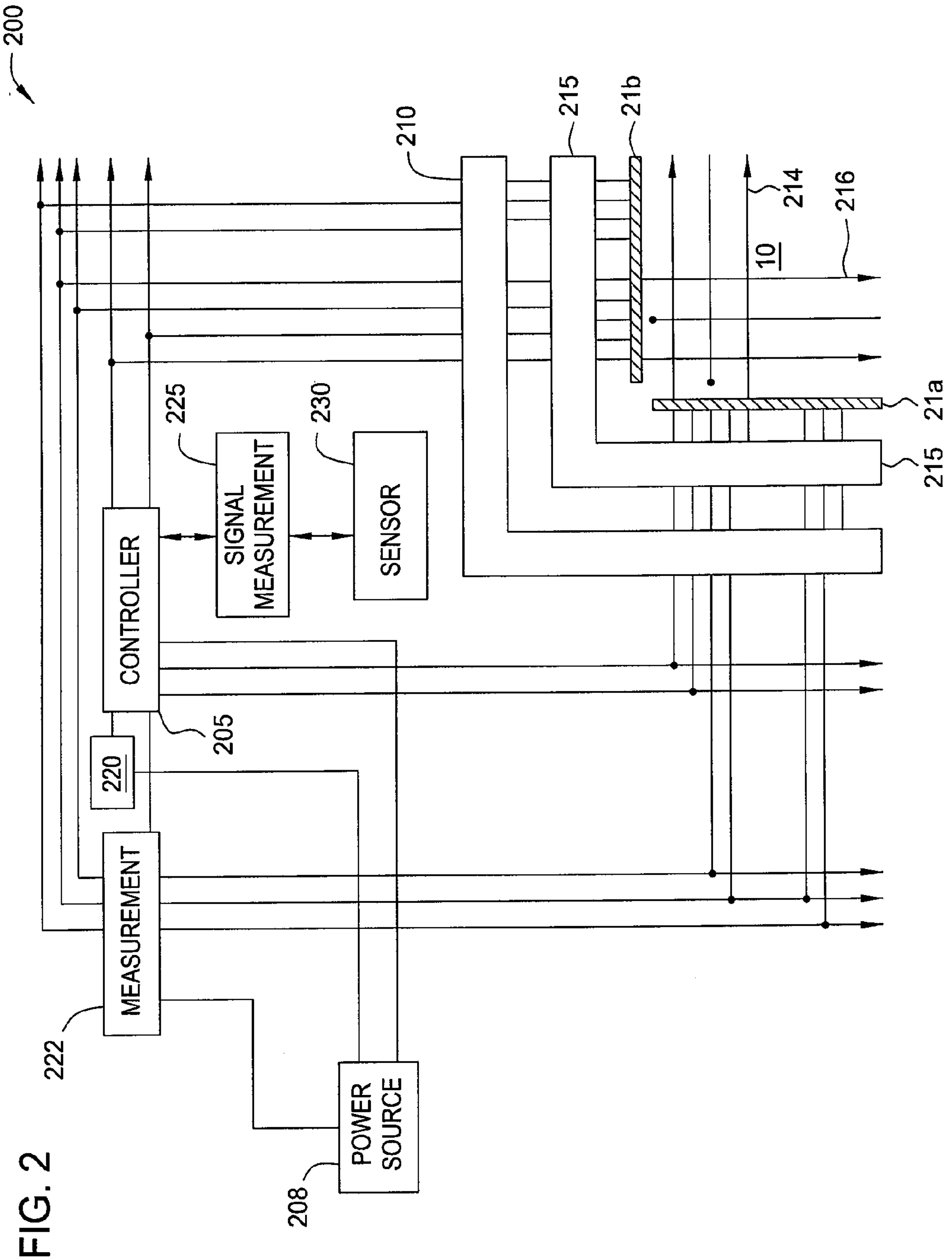
FIG. 2 is a schematic view of a test system that may be used for identifying malfunctioning pixels, in accordance with an embodiment of the present invention.

FIG. 2 is a schematic view of one embodiment of a test apparatus 200 for identifying malfunctioning pixels on a flat panel substrate 10. The test apparatus 200 may include a circuit interface 210 coupled to the flat panel substrate 10 under test via a prober 215 coupled to shorting bars 21*a* and 21*b*. The circuit interface 210 may relay signals from a pattern generating apparatus 220 and/or a measurement apparatus 222 to the data lines 214 and the gate lines 216 in communication with respective shorting bars. Optionally, the circuit interface 210 may relay signals from the data lines 214 and gate lines 216 to the measurement apparatus 222 and/or the pattern generating apparatus 220. A controller 205, such as a computer, may also be provided to govern whether the pattern generator 220 or measurement apparatus 222 is coupled to the flat panel substrate 10.

A signal measurement device 225 may be provided to sense voltage and/or current along the data lines 214 and/or the gate lines 216. An optional sensor 230 may also be used to detect signals from the data lines 514 and/or the gate lines 516. The signal measurement device 225 may be an electron beam (e-beam) column, a charge sensing apparatus, or a voltage imaging apparatus. The sensor 230 may be a secondary electron sensor adapted to sense backscatter electrons from the flat panel substrate 10. Alternatively, the sensor 230 may be a sensor configured to compliment any signal measurement device known in the art.

In operation, the controller 205 may be coupled to the flat panel substrate 10 through the prober 215. The prober 215 may be in communication with a power source 208 that, for example, may provide a signal to each of the contact points on the prober 215. The contact points may be in communication with respective data lines 214 and gate lines 216, which are coupled to the respective shorting bars 21*a* and 21*b*. In accordance with one or more embodiments of the invention, the controller 205 may be adapted to provide and/or measure the signals to or from the flat panel substrate 10.

An Exemplary Method for Localizing Driver Circuit Defects

The testing procedures described herein are exemplarily described using an electron beam or charged particle emitter, but certain embodiments described herein may be equally effective using optical devices, charge sensing, optical devices, capacitively coupled electrode arrangements, or other testing applications configured to test electronic devices on large substrates in vacuum conditions, or at or near atmospheric pressure. An exemplary testing system that may be used is described in United States Patent Application Publication No. 2006/0244467, which published on Nov. 2, 2006, and United States Patent Application Publication No. 2006/0273815, which published on Dec. 7, 2006. Each of the aforementioned Patent Publications is incorporated herein by reference.

Figure 3:
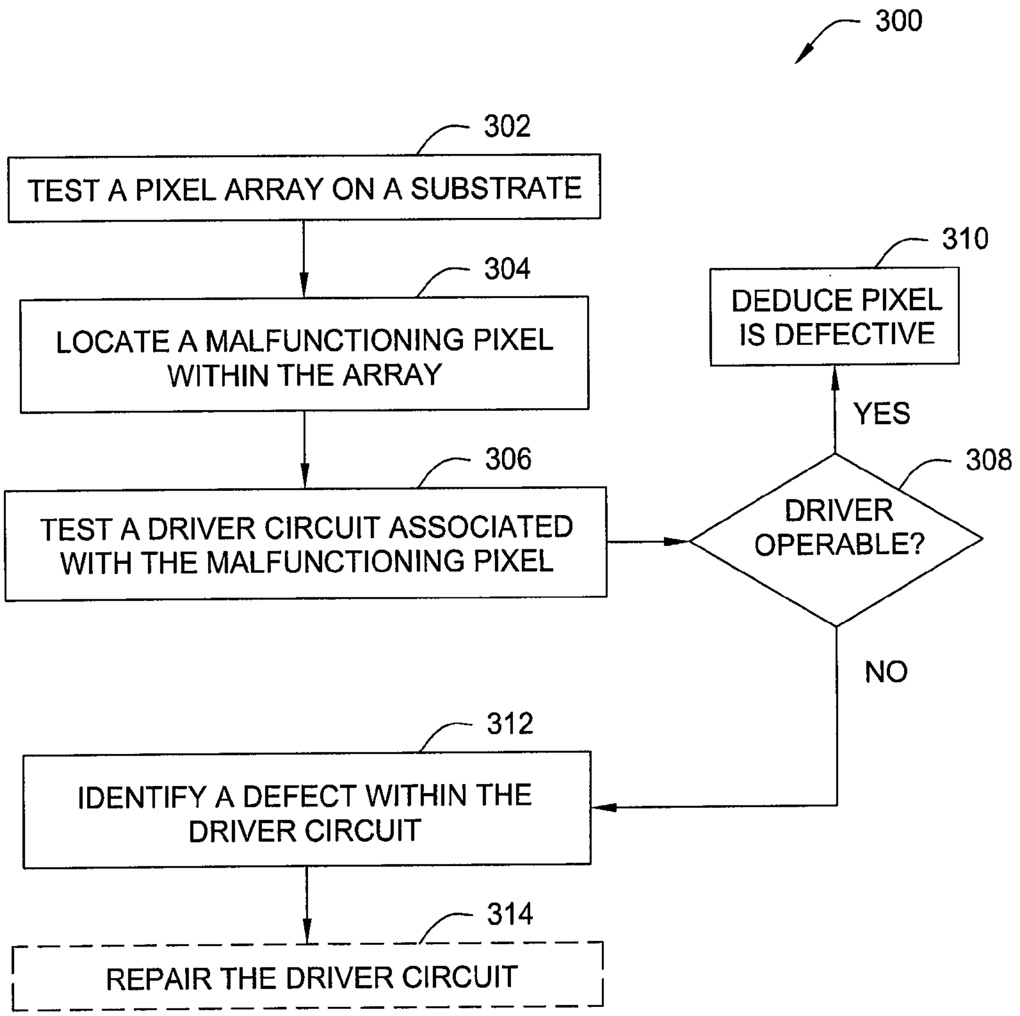
FIG. 3 is a flow chart of example operations for identifying whether a defect exists in a pixel or a driver circuit, in accordance with an embodiment of the present invention.

FIG. 3 is a flow chart of example operations 300 for identifying whether a defect exists in a pixel or a driver circuit. The operations begin, at step 302, by testing a pixel array on a substrate, such as on a liquid crystal display (LCD) panel. The testing may involve sensing voltages or charge stored in the pixels of the pixel array. Exemplary methods for testing pixels are described in U.S. Pat. No. 7,317,325, herein incorporated by reference.

At step 304, the sensed voltage or stored charge is used to locate and identify a malfunctioning or non-operating pixel caused by defects in the pixel itself, caused by a defect in the lines (e.g., data lines 14 or gate lines 16) coupled to the pixel, or caused by a defect in the driver circuit for the pixel. When a malfunctioning or non-operating pixel is identified at step 304, an additional testing procedure may be performed at step 306 on the driver circuit to determine if the driver circuit is the reason for the malfunctioning pixel. The additional testing may include sensing voltages at the driver circuit.

Sensing voltages may involve non-contact testing wherein no contact is made for measuring voltage. In one embodiment, contact is only made at the driver circuit input pads, shorting bars, other conductive contact points or pads disposed on the LCD at the perimeter of the pixel array, and combinations thereof. Various devices may be used to sense the voltages or charge. Examples include an electron beam, an electro-optical sensor, and an electrode in close proximity to the surface of the pixels and/or drivers capacitively coupled to the pixel or driver. Special contact pads (shown in FIG. 4 as test pads 414) may be provided at the input and/or at the output of each driver circuit in an effort to enable voltage sensing at the pads and to localize the driver defect. In the case of electron beam testing, the primary beam may be deflected to the specific positions of these test pads to sense voltages.

If the voltage sensed in the driver circuit or its output test pad is approximately equal to an expected voltage (i.e., within measurement tolerances), the driver may be deemed operable at step 308. In this case, the driver circuit is not defective, and the pixel (or the lines coupled to the pixel) may be deduced as being defective at step 310. Proper steps to repair the pixel or the lines coupled to the pixel may be taken.

If the voltage sensed in the driver circuit or at its input or output test pads is different from expected voltages at these locations, the driver may be deemed inoperable at step 308, and a defect within the driver circuit may be identified at step 312 and reported.

For some embodiments, the defective driver circuit may be repaired at step 314. Repair may include cutting an improper connection (e.g., a short circuit) within the driver circuit, depositing a conductive material to close an open circuit, and connecting a redundant driver structure to the circuit. Cutting connections, repairing connections, and/or coupling connections may be facilitated by a laser.

An Exemplary E-Beam Test System

Figure 4:
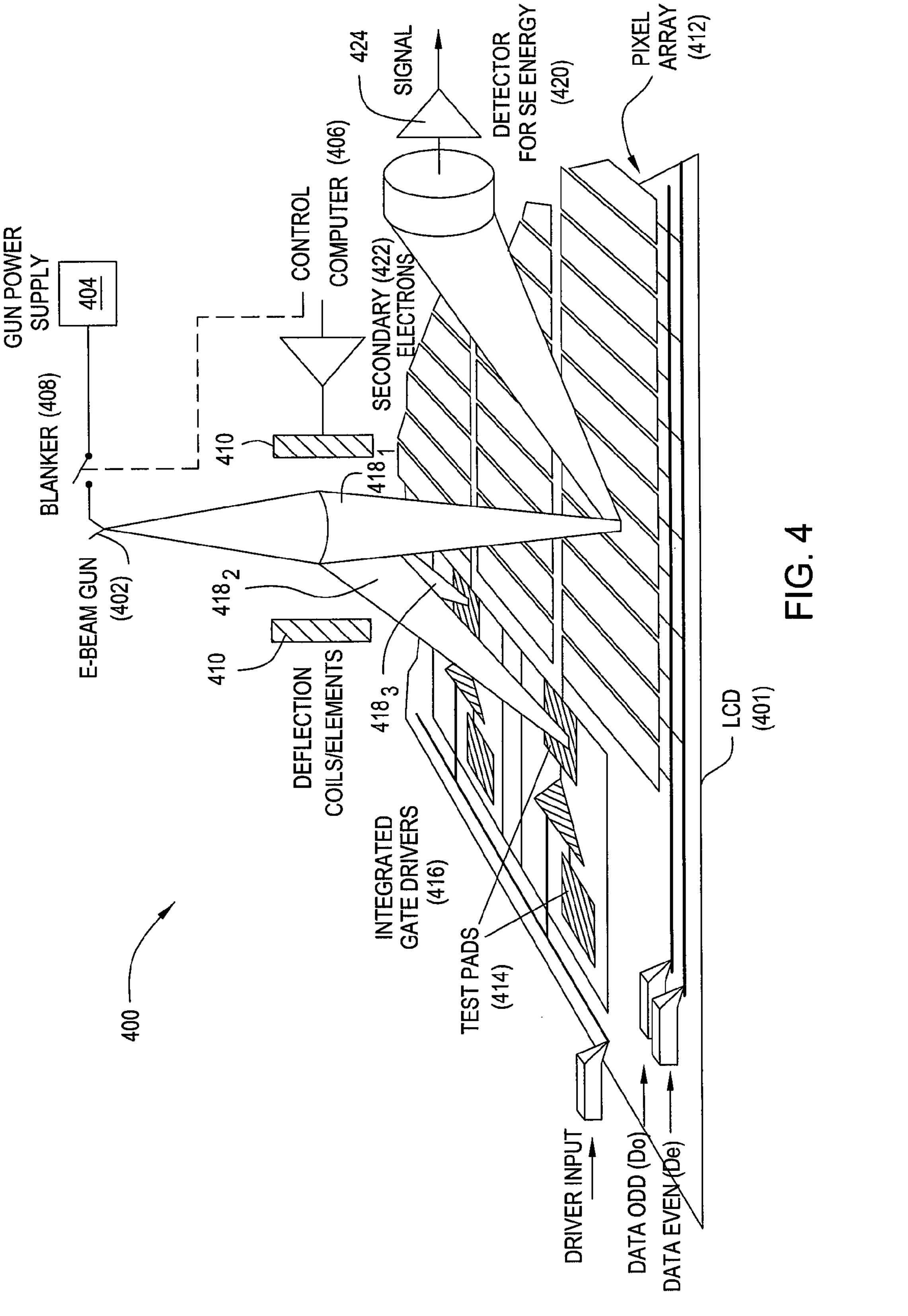
FIG. 4 illustrates an electron beam test system for localizing driver circuit defects associated with malfunctioning pixels of a large area substrate, in accordance with an embodiment of the present invention.

FIG. 4 illustrates an electron beam (e-beam) test system 400 for localizing driver circuit defects associated with malfunctioning pixels of a large area substrate, such as an LCD panel 401). In the test system 400, power to an e-beam gun 402 may be supplied from a gun power supply 404, and a control computer 406 may be used to control the operation of a blanker 408 in an effort to connect/disconnect power to the e-beam gun 402. The control computer 406 may also control operation (e.g., through executable software) of deflection elements 410 (e.g., deflection coils or plates) in an effort to steer the electron beam to individual pixels of the pixel array 412 fabricated on the LCD panel 401 at step 302 and to individual driver circuit test pads 414 at step 306 as described above. An integrated gate driver 416 may have a test pad 414 at its input, its output, or both as depicted in FIG. 4. If the voltage sensed at the output test pad is correct when testing the driver circuit for defects, it may be assumed that the voltage at the input test pad is correct, and the input test pad need not be tested.

To sense the voltage from the deflected e-beam 418, a detector 420 may be positioned in an effort to sense secondary electrons 422 backscattered when the primary electrons of the e-beam are deflected from the surface of the pixel or driver circuit test pad being tested. As the e-beam is deflected to test different pixels or test pads, the detector 420 may be repositioned to sense the backscattered secondary electrons 422. The detector 420 may be coupled to an amplifier 424 to produce a measurable signal, which may be sent to the control computer 406 or another device for analyzing the signal. With e-beam detection, the pixels and the driver circuit test pads may be tested quickly by steering the e-beam using the deflection elements 410 without any mechanical motion.

Figure 5:
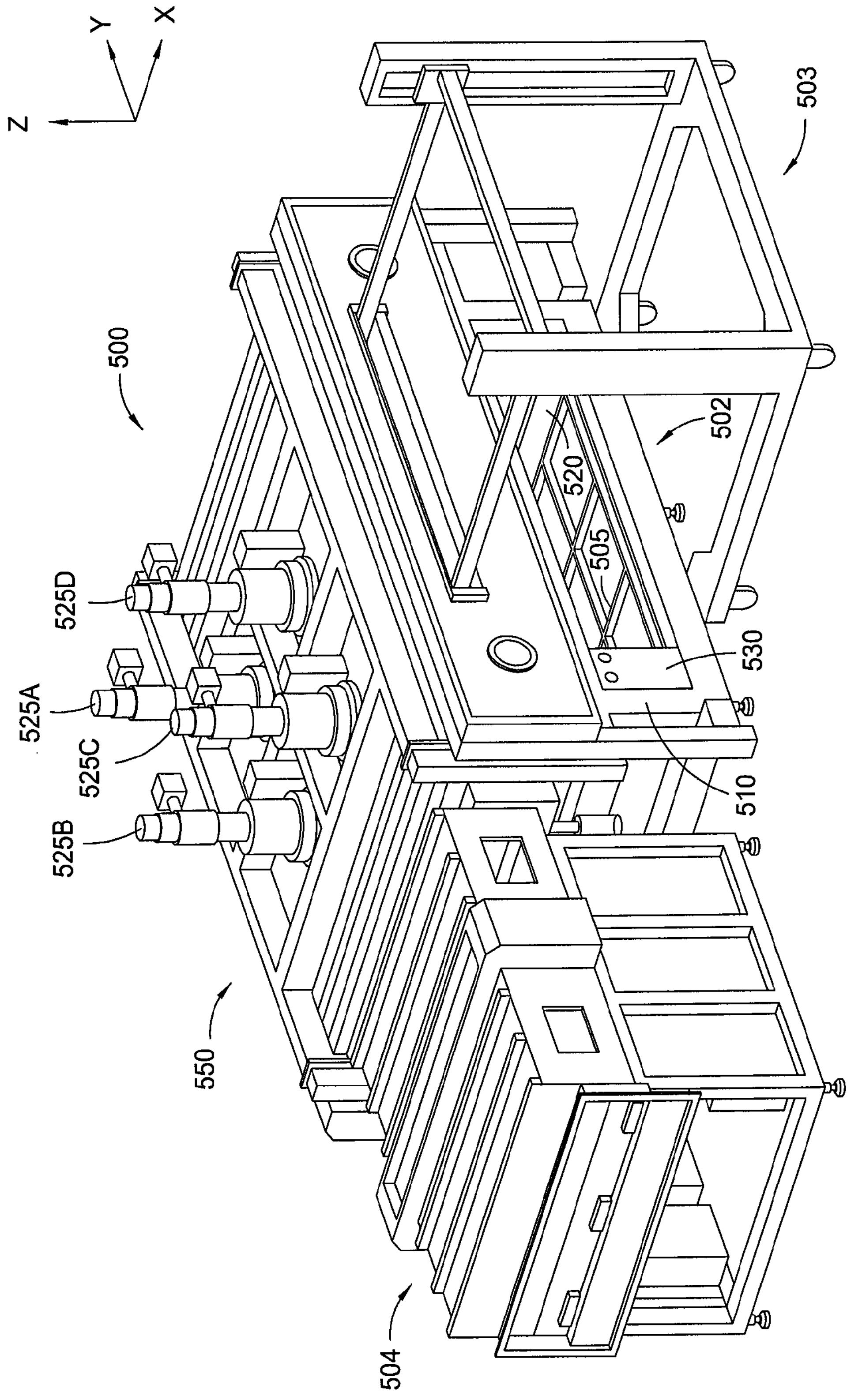
FIG. 5 illustrates an electron beam test apparatus that may be used for electron beam testing, in accordance with an embodiment of the present invention.

FIG. 5 illustrates an external view of an exemplary electron beam (e-beam) test system 500 that may be used for electron beam testing in connection with one or more embodiments of the invention. The electron beam test system 500 is an integrated system requiring minimum space and is capable of testing large glass panel substrates, up to and exceeding 1.9 meters by 2.2 meters. The electron beam test system 500 may include a prober storage assembly 502, a prober transfer assembly 503, a load lock chamber 504, and a testing chamber 550.

The prober storage assembly 502 may house one or more probers 505 proximal the test chamber 550 for easy use and retrieval. Preferably, the prober storage assembly 502 is disposed beneath the test chamber 550, reducing the clean room space needed for a contaminant free and efficient operation. The prober storage assembly 502 preferably has dimensions approximating those of the testing chamber 550 and is disposed on a mainframe 510 supporting the testing chamber 550. The prober storage assembly 402 may include a shelf 520 disposed about the mainframe 510 to provide a support for the one or more probers 505. The prober storage assembly 502 may further include a retractable door 530 that can seal off the storage area and protect the stored probers 505 when not in use.

The electron beam test system 500 may further include four electron beam test (EBT) columns 525A, 525B, 525C, and 525D. The EBT columns 525A/B/C/D may be disposed on an upper surface of the test chamber 550. During electron beam testing, certain voltages may be applied to the TFTs by using one or more probers, and the electron beam from an EBT column is directed to the individual pixels under investigation and/or to contact pads for the driver circuit. Secondary electrons emitted from the pixels or the contact pads may be sensed to determine the TFT or the driver circuit voltages, respectively. Additional details concerning the testing of pixels and the operation and features of the illustrative EBT test system 500 are disclosed in commonly assigned U.S. Pat. No. 6,833,717, which issued Dec. 21, 2004, entitled “Electron Beam Test System with Integrated Substrate Transfer Module,” which is incorporated herein in its entirety by reference.

Exemplary Substrate Testing and Repair

Figures 6A, 6B, 6C:
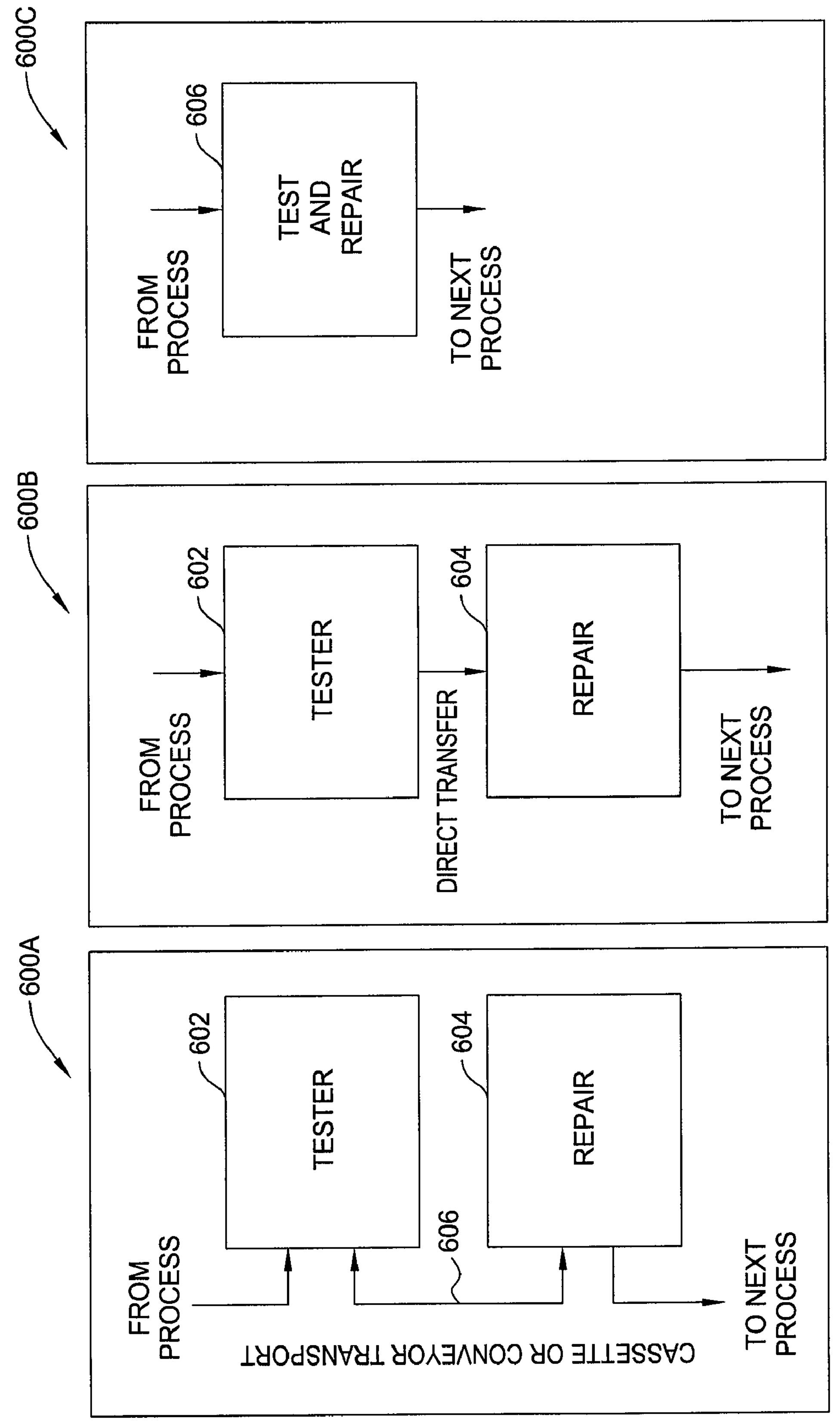
FIGS. 6A-C illustrate various large area substrate testing and repair setups, in accordance with embodiments of the present invention.

FIGS. 6A-6C are schematic diagrams 600A, 600B, 600C showing various testing and repair embodiments. FIG. 6A illustrates a discrete testing and repair device having a cassette or conveyor device transfer mechanism for transporting a large area substrate from fabrication in a process chamber, for example, to a tester 602. The pixel array and driver circuits may be tested in the tester 602, and a large area substrate with a defective driver circuit may be transferred via the cassette or conveyor device to a repair station 604. Similarly, FIG. 6B depicts direct transfer mechanism via a robot and/or end effector arrangement for transferring the large area substrate between the tester 602 and the repair station 604. FIG. 6C portrays an integrated test and repair device 606 wherein testing and potential driver circuit repair take place in a single location before the substrate moves to the next process.

While the foregoing is directed to embodiments of the present invention, other and further embodiments of the invention may be devised without departing from the basic scope thereof, and the scope thereof is determined by the claims that follow.

The invention claimed is:

1. A method for identifying a defective driver circuit on a substrate having a plurality of pixels located thereon, comprising:

testing at least a portion of the plurality of pixels to determine the operability of the pixels in the portion of the plurality;

locating a malfunctioning pixel within the plurality;

testing a driver circuit associated with the malfunctioning pixel; and locating a defect within the driver circuit.

2. The method of claim 1, wherein testing the plurality of pixels comprises using one of electron beam testing, voltage image capturing, charge sensing with an electro-optical sensing device, or an electrode capacitively coupled to the plurality.

3. The method of claim 1, wherein testing the driver circuit comprises using one of electron beam testing, voltage image capturing, charge sensing with an electro-optical sensing device, or an electrode capacitively coupled to the driver circuit.

4. The method of claim 1, wherein the driver circuit is a data line or a gate line.

5. The method of claim 1, wherein locating the defect within the driver circuit comprises sensing a voltage that is different than an expected voltage.

6. The method of claim 1, wherein the driver circuit comprises an input and an output and the substrate comprises a contact pad coupled to the input or the output.

7. The method of claim 6, wherein testing the driver circuit comprises sensing a voltage at the contact pad.

8. The method of claim 6, wherein testing the driver circuit comprises sensing a charge at the contact pad.

9. The method of claim 1, further comprising repairing the defect within the driver circuit.

10. The method of claim 9, wherein repairing the defect comprises connecting redundant driver structures to the circuit.

11. The method of claim 9, wherein repairing the defect comprises at least one of cutting connections within the driver circuit and depositing conductive material to close opens within the driver circuit.

12. A computer-readable medium containing a program for identifying a defective driver circuit on a substrate having a plurality of pixels located thereon, which, when executed by a processor, performs operations comprising:

testing the plurality of pixels to determine the operability of each pixel in the plurality;

locating a malfunctioning pixel within the plurality;

testing a driver circuit associated with the malfunctioning pixel; and locating a defect within the driver circuit.

13. The computer-readable medium of claim 12, wherein testing the driver circuit comprises using one of electron beam testing, voltage image capturing, charge sensing with an electro-optical sensing device, or an electrode capacitively coupled to the driver circuit.

14. The computer-readable medium of claim 12, wherein the driver circuit comprises an input and an output and the substrate comprises a contact pad coupled to the input or the output.

15. The computer-readable medium of claim 14, wherein testing the driver circuit comprises sensing a voltage or a charge at the contact pad.

16. An apparatus for identifying a defective driver circuit on a substrate having a plurality of pixels located thereon, comprising:

an electron beam gun for producing an electron beam;

one or more deflection elements configured to deflect the electron beam to at least one pixel of the plurality of pixels and to one or more test pads coupled to a driver circuit associated with the at least pixel; and a sensor for detecting secondary electrons backscattered from the at least one pixel or the test pads.

17. The apparatus of claim 16, further comprising a controller configured to control operation of the deflection elements.

18. The apparatus of claim 16, further comprising a controller coupled to the sensor and configured to determine whether the at least one pixel is malfunctioning and use the test pads coupled to the driver circuit associated with the malfunctioning pixel to locate a defect within the driver circuit based on a signal from the sensor.

19. The apparatus of claim 18, wherein the controller is configured to locate the defect within the driver circuit by sensing a voltage that is different than an expected voltage.

20. The apparatus of claim 16, wherein the one or more test pads comprise at least one of an input test pad coupled to the input of the driver circuit or an output test pad coupled to the output of the driver circuit.

* * * * *